(12) United States Patent
Lee

(10) Patent No.: US 7,847,332 B2
(45) Date of Patent: Dec. 7, 2010

(54) NONVOLATILE MEMORY DEVICES WITH OBLIQUE CHARGE STORAGE REGIONS AND METHODS OF FORMING THE SAME

(75) Inventor: Woon-Kyung Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 882 days.

(21) Appl. No.: 11/615,098

(22) Filed: Dec. 22, 2006

(65) Prior Publication Data

US 2007/0210370 A1 Sep. 13, 2007

(30) Foreign Application Priority Data

Mar. 13, 2006 (KR) .................. 10-2006-0023197

(51) Int. Cl.
*H01L 29/788* (2006.01)

(52) U.S. Cl. .............. 257/314; 257/315; 257/316; 438/257; 438/263

(58) Field of Classification Search ......... 257/205–206, 257/314–318; 438/257–265
See application file for complete search history.

(56) References Cited

U.S. PATENT DOCUMENTS 6,403,413 B2  6/2002  Hayano et al.

2005/0073002 A1 * 4/2005 Tokumitsu .................. 257/324

FOREIGN PATENT DOCUMENTS

| JP | 11-176956 A | 7/1999 |
|---|---|---|
| JP | 2002-31883 A | 1/2002 |
| KR | 0164075 B1 | 9/1998 |
| KR | 2000-0000925 A | 1/2000 |
| KR | 2001-0060046 A | 7/2001 |
| KR | 20020007195 A | 1/2002 |
| KR | 2003-0092861 A | 12/2003 |

* cited by examiner

*Primary Examiner*—Eugene Lee
*Assistant Examiner*—Tucker Wright
(74) *Attorney, Agent, or Firm*—Myers Bigel Sibley & Sajovec

(57) ABSTRACT

A nonvolatile memory device includes an active region defined by a device isolation layer in a semiconductor substrate, a word line passing over the active region and a charge storage region defined by a crossing of the active region and the word line and disposed between the active region and the word line. The charge storage region is disposed at an oblique angle with respect to the word line.

4 Claims, 16 Drawing Sheets

NONVOLATILE MEMORY DEVICES WITH OBLIQUE CHARGE STORAGE REGIONS AND METHODS OF FORMING THE SAME

CROSS-REFERENCE TO RELATED APPLICATION

This application claims the benefit under 35 USC §119 of Korean Patent Application No. 10-2006-0023197, filed on Mar. 13, 2006, the disclosure of which is hereby incorporated by reference in its entirety as if set forth fully herein.

FIELD OF THE INVENTION

The present invention relates to integrated circuit memory devices, and more particularly, to nonvolatile memory devices and methods of forming the same.

BACKGROUND OF THE INVENTION

Generally, integrated circuit memory devices can be classified into volatile memory devices and nonvolatile memory devices. The volatile memory devices lose stored data when power is removed, whereas the nonvolatile memory devices still maintain stored data even when power is removed.

Flash memory devices are one kind of the nonvolatile memory devices and are high-integration devices that may combine aspects of an erasable programmable read only memory (EPROM) which can be programmed and erased, with aspects of an electrically erasable programmable read only memory (EEPROM) which can be electrically programmed and erased.

The flash memory devices may be classified into floating gate type flash memory devices and charge trap type flash memory devices depending on the kind of charge storage layer that constitutes a unit cell. Also, the flash memory devices may be classified into stacked gate type flash memory devices and split gate type flash memory devices depending on a unit cell structure.

Also, the flash memory devices can be classified into NOR type flash memory devices and NAND type flash memory devices. Since the NOR type flash memory device can control the respective memory cells independently, it can provide relatively high speed operation. However, the NOR type flash memory device may have a relatively large cell area because it may need one contact per two cells. On the other hand, since the NAND type flash memory can integrally control a plurality of memory cells connected to one string, it may provide a relatively high integration density.

FIG. 1 is a partial equivalent circuit diagram of a conventional general memory device, and FIG. 2 is a plan view of a conventional general NAND memory device.

Referring to FIG. 1, a NAND flash memory device includes a cell array comprised of a plurality of cell strings. Each cell string includes a ground select transistor and a string select transistor connected in series between a source region and a drain region, and a plurality of memory cells connected in series between the ground select transistor and the string select transistor. The cell array includes a plurality of ground select lines GSL and a plurality of string select lines SSL, and a plurality of word lines WL disposed between a string select line SSL and a ground select line GSL. Also, bit lines BL intersecting the plurality of word lines are provided. Each bit line is connected to the drain region through a bit line contact DC. A common source line CSL is disposed between the ground select lines GSL. The source regions are electrically connected to one another by the common source line CSL.

Referring to FIG. 2, active regions 12 are defined by a device isolation layer 15 formed in a substrate such as a semiconductor substrate. The active regions 12 extend in a first direction DA. The ground select lines GSL, string select lines SSL and word lines WL are disposed crossing over the active regions 12. The word lines WL and the select lines GSL and SSL extend in a second direction DW orthogonal to the first direction DA. The common source line CSL crossing over the active regions and electrically connected to the underlying active regions is disposed between the ground select lines GSL of the cell strings adjacent to each other, and bit line contacts DC are connected to the active regions between the adjacent string select lines SSL and are also connected to the bit lines (not shown) crossing over the word lines WL. Floating gates 24, serving as charge storage regions, are disposed on regions where the active regions and the word lines WL cross. The floating gates 24 are positioned between the active regions 12 and the word lines WL. When the width of the active region 12, the width of the word line WL, the width between the active regions 12 and the width between the word lines are all equal to 'a', a floating gate positioned at a center is adjacent to two floating gates spaced apart by the distance 'a' in the first direction DA, and adjacent to two floating gates spaced apart by the distance 'a' in the second direction DW, and adjacent four floating gates spaced apart by the distance $\sqrt{2}$a in the diagonal directions.

As the memory device becomes more highly integrated, the parasitic capacitance between the floating gates may increase and thus a malfunction of the memory device, e.g., a program disturbance between memory cells, may be caused.

FIG. 3 is a partial perspective view of a memory device for illustrating a relationship between the floating gate voltage and the parasitic capacitance.

Referring to FIG. 3, a gate structure 20, in which a tunnel oxide layer 22, a floating gate 24, an insulating layer such as an ONO layer 26, and a control gate 28 are sequentially stacked, is formed on an active region 12 defined by a device isolation layer 15 formed in a substrate 10. The active region 12 extends in a first direction DA, and the control gate 28 extends in a second direction DW to constitute a word line. An interlayer insulating layer (not shown) is positioned between the adjacent gate structures in the first direction DA.

Reference symbols V and C marked on the drawing represent voltage and capacitance in a corresponding position. $V_{fg}$ indicates a voltage of the floating gate positioned at a center among nine floating gates that are illustrated. VA indicates a voltage of the floating gates adjacent to the center floating gate in the first direction DA, and VW indicates a voltage of the floating gates adjacent to the center floating gate in the second direction DW. Also, $C_{fgw}$ indicates a parasitic capacitance generated between the floating gates adjacent in the second direction DW.

A word line made of a conductive layer is interposed between two adjacent floating gates in the second direction DW, which can reduce or suppress a parasitic capacitance $C_{fgw}$ from being generated. However, since only the interlayer insulating layer is positioned between two adjacent floating gates in the first direction, the generation of the parasitic capacitance $C_{fgw}$ may not be effectively suppressed. In other words, a floating gate may have a larger electrical interference due to the adjacent floating gates in the first direction DA rather than the adjacent floating gates in the second direction DW. As a result, the reliability and/or operation characteristics may be deteriorated.

SUMMARY OF THE INVENTION

Some embodiments of the present invention provide nonvolatile memory devices that include an active region defined by a device isolation layer in a substrate; a word line crossing the active region; and a nonvolatile memory cell charge storage region defined by a crossing of the active region and the word line and disposed between the active region and the word line. The nonvolatile memory cell charge storage region is disposed at an oblique angle with respect to the word line. In other embodiments, the nonvolatile memory cell charge storage region is configured as a parallelogram with oblique angles, in plan view.

In some embodiments, the active region may extend in a first direction and the word line may extend in a second direction crossing the first direction. The first direction is oblique (not orthogonal and not parallel) to the second direction. For example, an angle between the first direction and the second direction may be about 45°. Other embodiments may further include a bit line crossing the word line and extending along a third direction crossing the first direction and the second direction. The third direction may be orthogonal to the second direction.

In some embodiments, the active region may extend in a first direction and the word line may extend in a second direction orthogonal to the first direction. At least a portion of the active region may have a zigzag configuration. The zigzag portion of the active region may have a corner which is positioned adjacent a side surface of the word line. Other embodiments may further comprise string selection lines and ground selection lines extending in the second direction. The active region disposed between the string selection line and the ground selection line may have a zigzag configuration, and the active region disposed between the string selection lines and between the ground selection lines may have a straight line configuration.

Other embodiments of the present invention provide nonvolatile memory devices that include active regions defined by a device isolation layer in a substrate; word lines crossing the active regions; and charge storage regions defined by crossings of the active regions and the word lines and disposed between the active regions and the word lines. An area of an overlapping portion of side surfaces of the adjacent charge storage regions facing each other in parallel in a direction orthogonal to a direction in which the word lines extend is smaller than an area of each of the side surfaces facing each other. In some embodiments, the overlapping portion may not exist at all.

In some embodiments, the active regions may extend in a first direction, and the word lines may extend in a second direction crossing the first direction. The first direction is oblique to the second direction. For example, an angle between the first direction and the second direction may be about 45°.

In other embodiments, the active regions may extend in a first direction, and the word lines may extend in a second direction orthogonal to the first direction. At least a portion of the active regions may have a zigzag configuration. Moreover, the active regions may have corners which are positioned adjacent side surfaces of the word lines. Some embodiments may further comprise string selection lines and ground selection lines extending in the second direction. In some embodiments, the active regions disposed between the string selection lines and the ground selection lines may have a zigzag configuration, and the active regions disposed between the string selection lines and between the ground selection lines may have a straight line configuration.

Yet other embodiments of the present invention provide methods for forming nonvolatile memory devices. These methods may comprise forming a device isolation layer defining an active region in a substrate; forming a nonvolatile memory cell charge storage layer on the active region; and forming a word line crossing the charge storage layer and crossing the active region. The nonvolatile memory cell charge storage region is defined by a crossing of the active region and the word line, and is formed at an oblique angle with respect to the word line.

In some embodiments, the active region may be formed to extend in a first direction and the word line may be formed to extend in a second direction which is oblique to the first direction. For example, an angle between the first direction and the second direction may be about 45°.

Other embodiments may further include forming a bit line crossing the word line and extending in a third direction crossing the second direction at a right angle.

In other embodiments, the active region may be formed to extend in a first direction and the word line may be formed to extend in a second direction orthogonal to the first direction. At least a portion of the active region may be formed in a zigzag configuration. In some embodiments, the word line may be formed such that a side surface thereof is positioned adjacent a corner of the active region.

Other embodiments may further comprise forming string selection lines and ground selection lines extending in the second direction while forming the word line, wherein the active region is formed in a zigzag shape only between the string selection lines and the ground selection lines.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
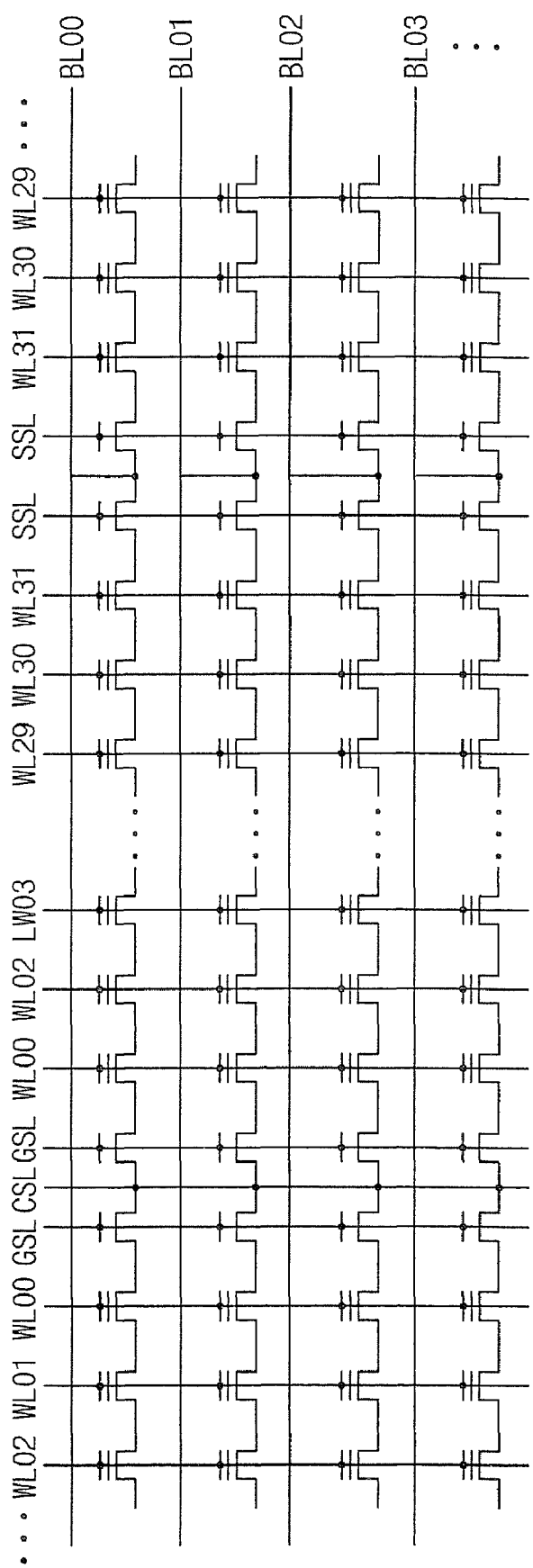
FIG. 1 is a partial equivalent circuit diagram of a conventional general memory device.
Figure 2:
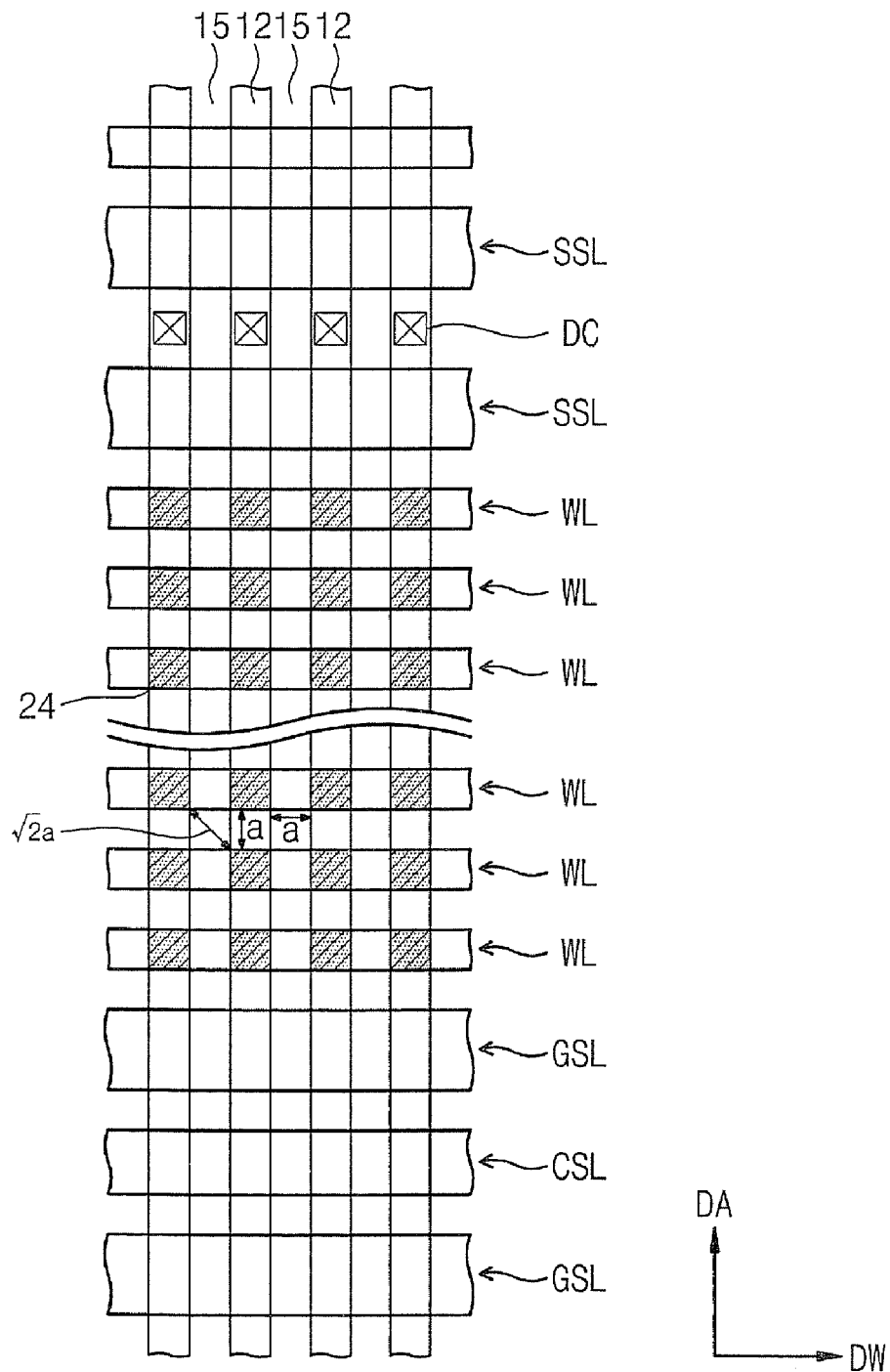
FIG. 2 is a plan view of a conventional general NAND memory device.
Figure 3:
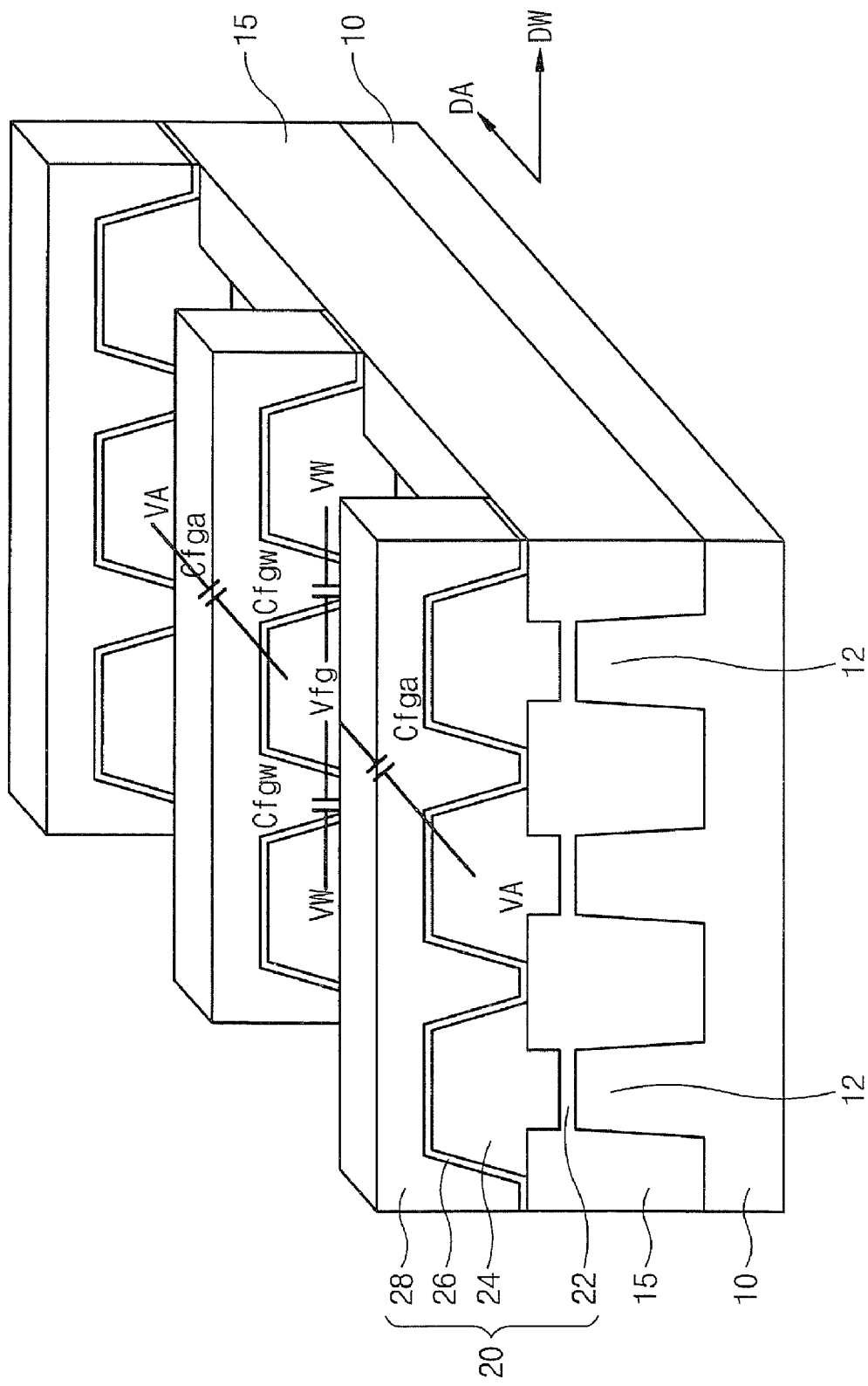
FIG. 3 is a partial perspective view of a conventional flash memory device for illustrating a relationship between a floating gate voltage and a parasitic capacitance.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

While embodiments of the present invention exemplarily describe a floating gate type flash memory device, they are merely illustrative. It is to be understood that the present invention is not limited to such embodiments but may be applied to other type flash memory devices that use charge storage regions.

Figure 4:
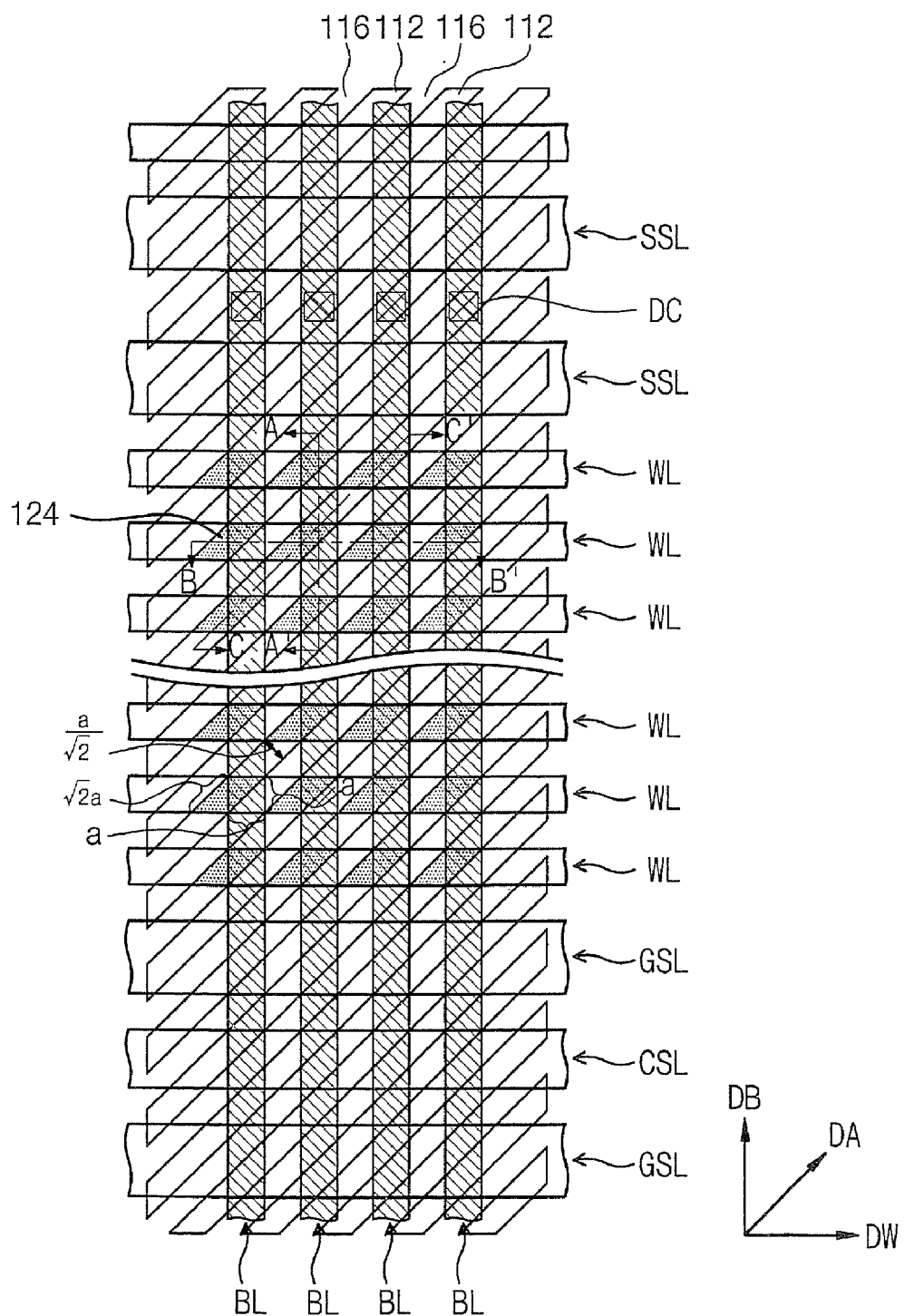
FIG. 4 is a schematic plan view of a nonvolatile memory device according to various embodiments of the present invention.
Figure 5A:
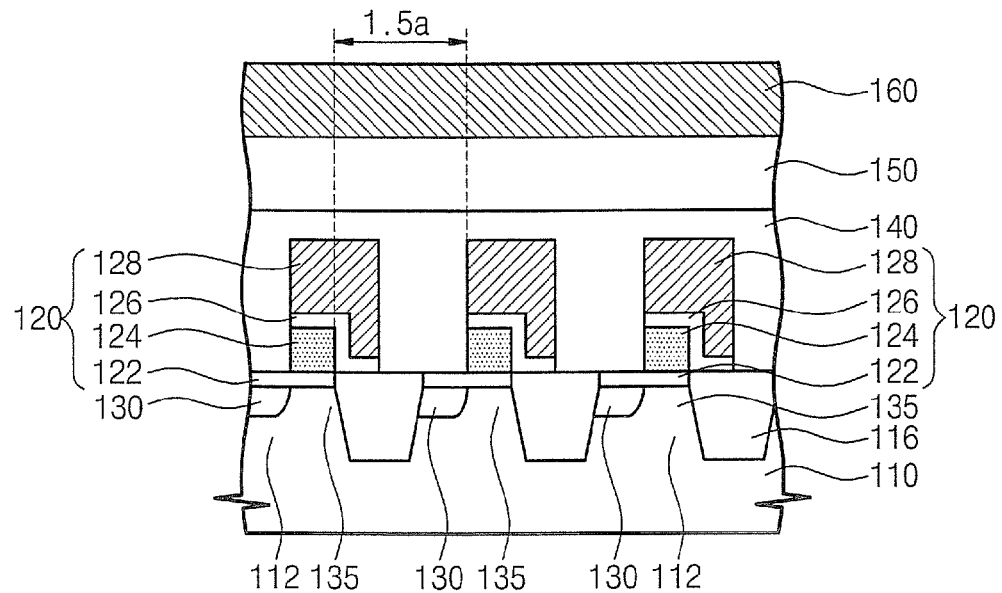
FIGS. 5A through 5C are cross-sectional views taken along the lines A-A', B-B' and C-C', respectively, of FIG. 4.
Figure 5B:
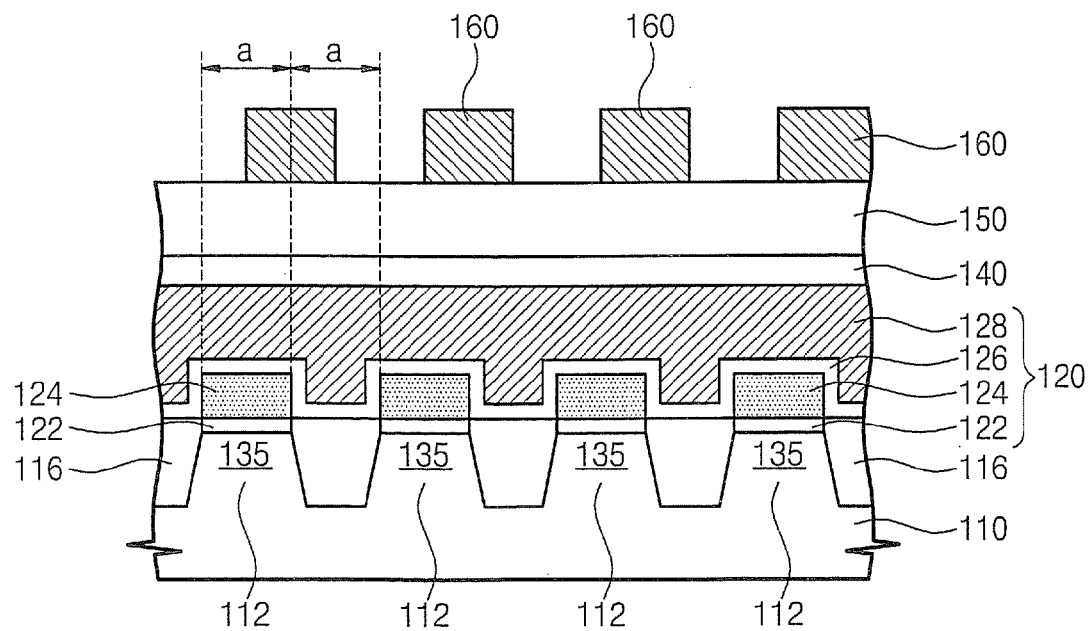
Figure 5C:
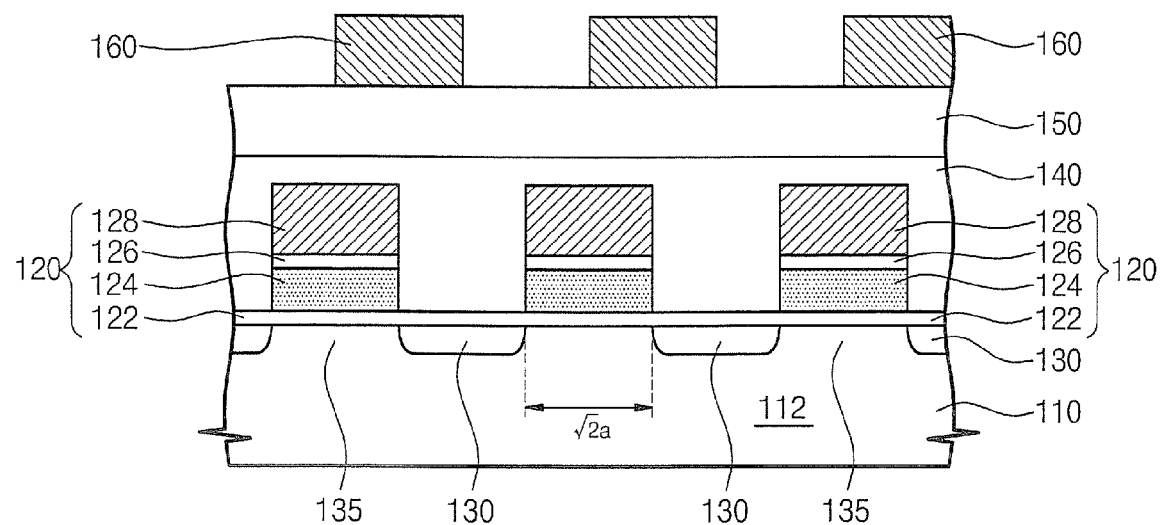

FIG. 4 is a schematic plan view of a nonvolatile memory device according to various embodiments of the present invention, and FIGS. 5A through 5C are cross-sectional views taken along the lines A-A', B-B' and C-C', respectively, of FIG. 4.

First, referring to FIG. 4, at least two active regions are defined by a device isolating layer pattern 116 formed in a substrate such as a semiconductor substrate. The active regions 112 extend in a first direction DA. String selection lines SSL and ground selection lines GSL are arranged running over the active regions 112. At least two word lines WL are arranged between the string selection lines SSL and the ground selection lines GSL. A bit line contact DC is disposed on each of the active regions between the string selection lines SSL, and a common source line CSL is disposed between the ground selection lines GSL. The word lines WL, the selection lines SSL and GSL, and the common source line CSL extend in a second direction DW oblique to the first direction DA.

In contrast to conventional devices, in some embodiments of the present invention, the first direction DA may not be orthogonal to the second direction DW. For example, an angle between the first direction DA and the second direction DW may be about 45°. The active regions between the ground selection lines GSL are electrically connected with each other by the common source line CSL running over the active regions. The active regions between the string selection lines SSL are electrically connected with the bit lines BL running over the word line by the bit line contact DC. The bit lines BL extend in a third direction DB crossing the first direction DA and the second direction DW. For example, angles between the third direction DB and the first direction DA and between the third direction DB and the second direction DW may be about 45° and about 90°, respectively.

Charge storage regions are defined by a crossing of the active regions 112 and the word lines WL. The charge storage regions are positioned between the active regions 112 and the word lines WL. The charge storage region may be a floating gate 124 in a floating gate nonvolatile memory cell. The floating gates 124 are arranged in a matrix or array configuration (e.g., in the second direction DW and the third direction DB). In case where two side surfaces opposing each other in the third direction DB among the four side surfaces of the floating gate 124 have a length 'a' and a width of the word line WL is 'a', the area occupied by the floating gate 124 is '$a^2$' as is conventional. However, the remaining two side surfaces of the floating gate 124 opposing each other in the second direction DW have a length '$\sqrt{2}a$', respectively, and the length '$\sqrt{2}a$' becomes the length of the channel region positioned below the floating gate 124. Therefore, the length of the channel region according to these embodiments can become greater than is conventional, and thus a short channel effect can be reduced or prevented. Also, the width of the active region 112 is reduced to '$a/\sqrt{2}$'. As also shown, the charge storage regions, embodied by the floating gates 124, are configured as parallelograms with oblique angles, in plan view.

Again referring to FIG. 4, an interval between the floating gates 124 arranged in the second direction DW is 'a', but an interval between the floating gates 124 arranged in the third direction DB is greater than 'a'. In other words, since the floating gate 124 has a slant angle in the second direction DW, an area of an overlapping portion of side surfaces facing each other in parallel of the floating gates 124 that are adjacent one another in the third direction DB, is smaller than an area of each of the side surfaces facing each other in parallel of the floating gates 124, or the overlapping portion may not be present at all. That is, a given floating gate may be disposed crossing the floating gate positioned at the shortest distance from an adjacent word line thereto such that they do not face each other. Accordingly, electrical interference generated between the floating gates adjacent one another in the third direction can be reduced dramatically. Thus, the reliability and/or operation characteristic of the nonvolatile memory device can be enhanced.

Referring to FIGS. 5A through 5C, a gate structure 120 is positioned on the active region 112 of the semiconductor substrate 110. The gate structure 120 comprises a gate insulating layer 122, the floating gate 124, an intergate insulating layer 126, and a control gate 128 sequentially stacked. Impurity regions functioning as source/drain regions are positioned in the active regions 112 at both sides of the gate structure 120. The distance between the floating gates 124 adjacent in the third direction is about 1.5a, which is greater than the distance, 'a' between the floating gates adjacent one another in the second direction. The distance between the floating gates 124 adjacent in the third direction may vary depending on the position of the section. However, since the value is greater than the length 'a', the electrical interference that may be generated between the adjacent floating gates in the third direction DB can be reduced. Also, since the length of the channel region 135 below the gate structure 120 is increased, the short channel effect can be reduced.

An interlayer insulating layer 140, 150 covers the gate structure 120. A bit line 160, extending in the third direction DB, is on the interlayer insulating layer 150.

Figure 6:
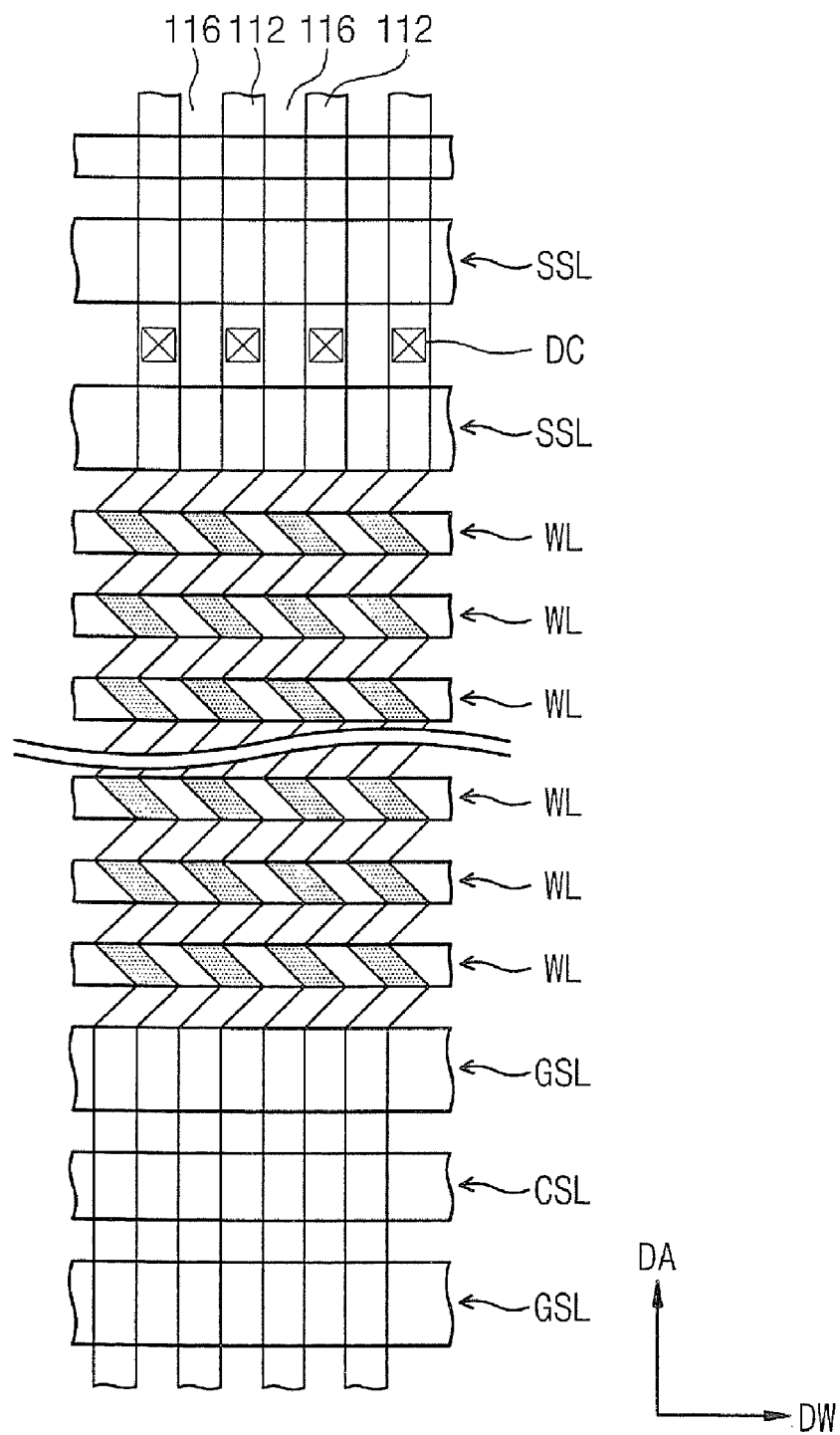
FIG. 6 is a schematic plan view of a nonvolatile memory device according to other embodiments of the present invention.
Figure 7A:
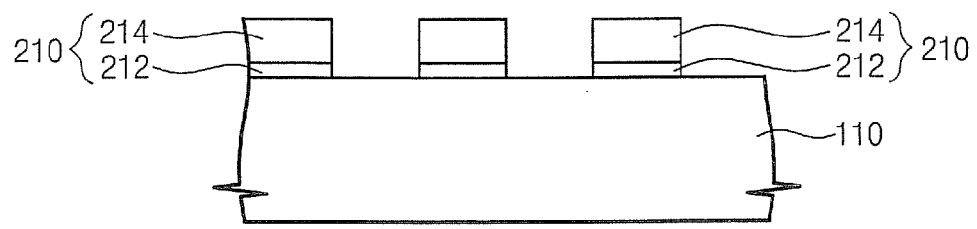
FIGS. 7 through 14 are cross-sectional views illustrating methods of forming nonvolatile memory devices according to various embodiments of the present invention.
Figure 7B:
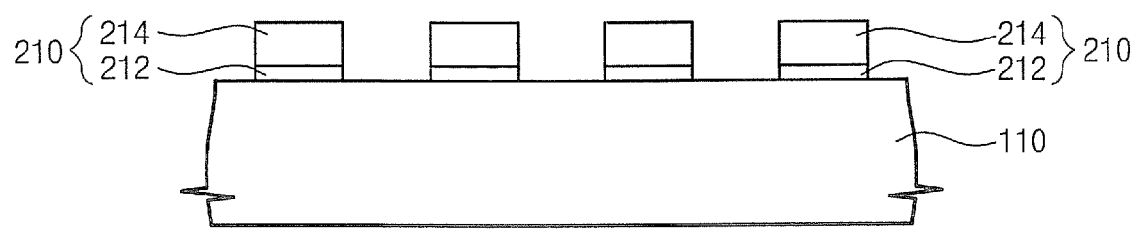
Figure 7C:
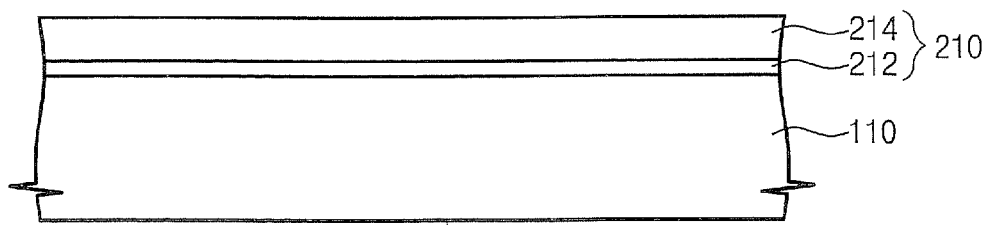
Figure 8A:
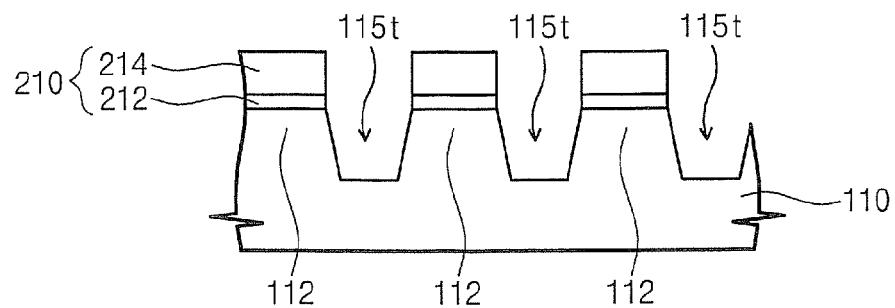
Figure 8B:
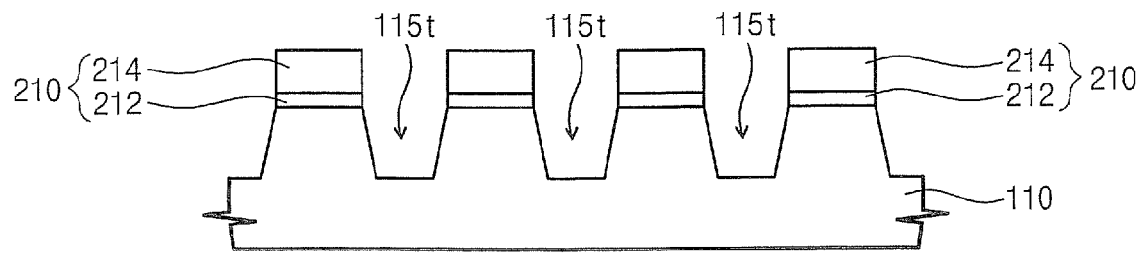
Figure 8C:
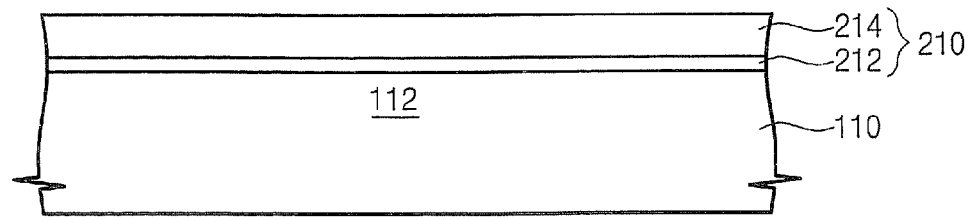
Figure 9A:
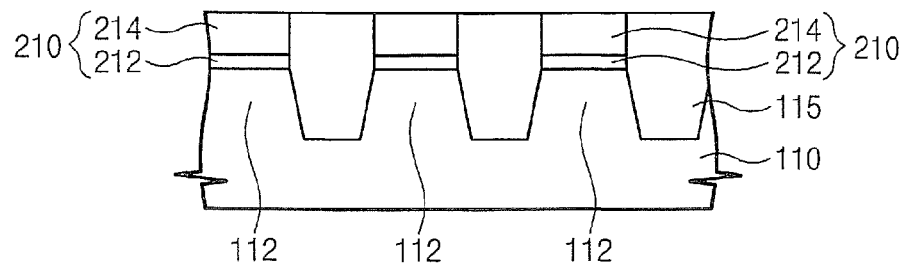
Figure 9B:
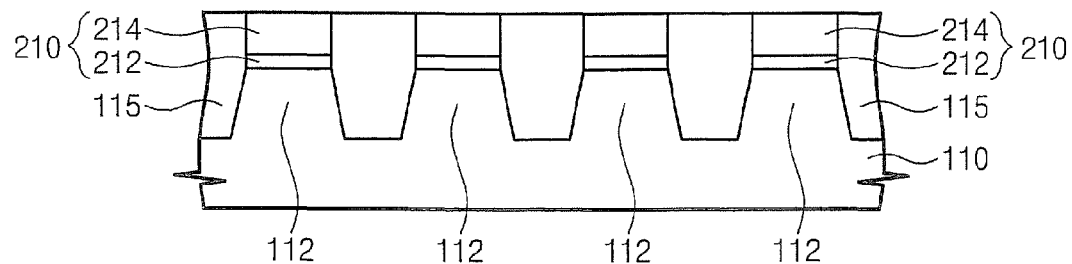
Figure 9C:
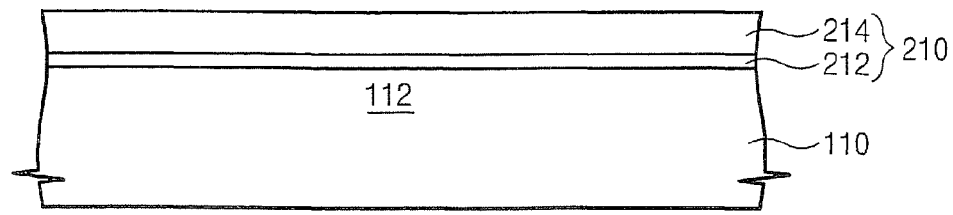
Figure 10A:
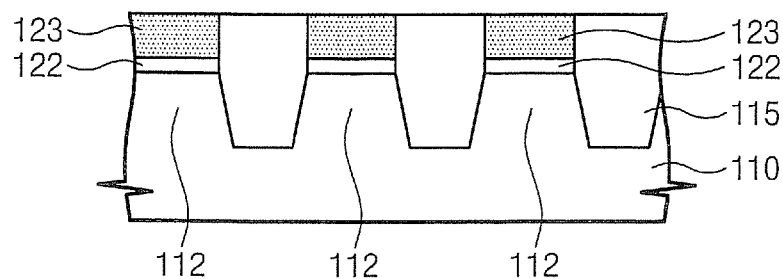
Figure 10B:
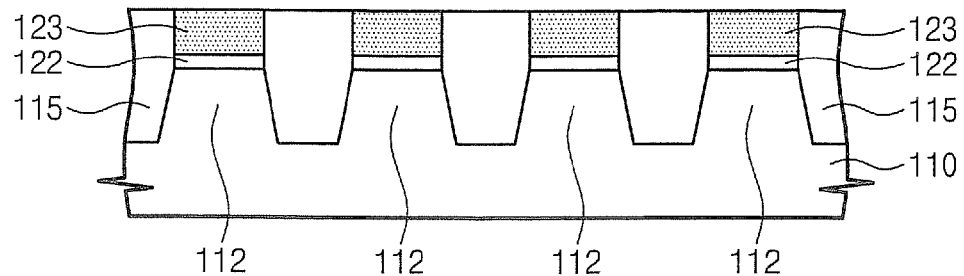
Figure 10C:
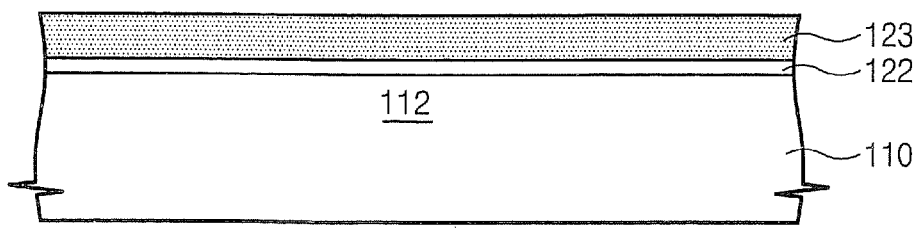
Figure 11A:
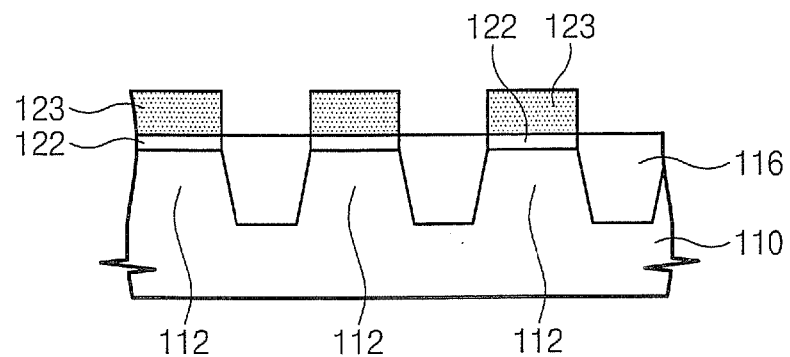
Figure 11B:
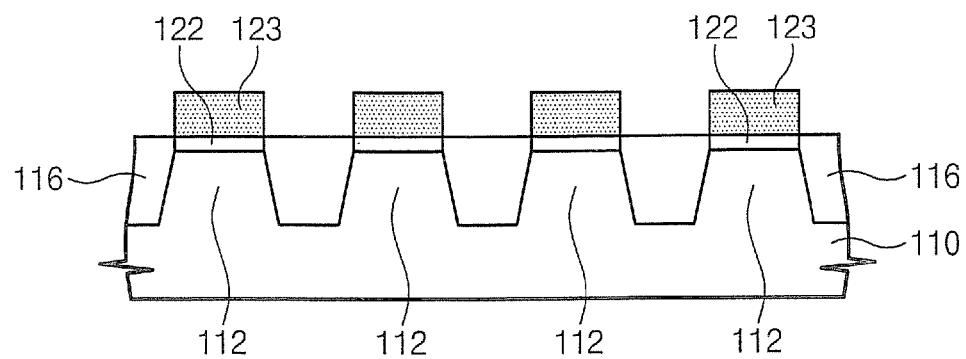
Figure 11C:
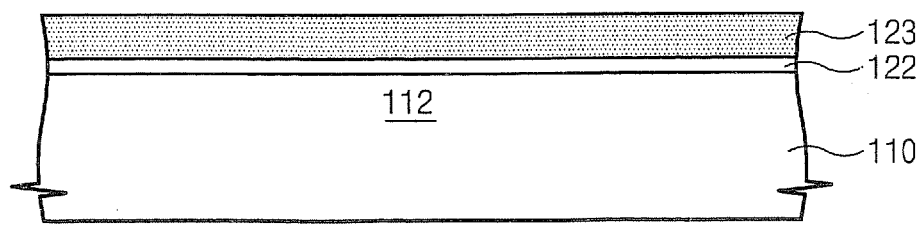
Figure 12A:
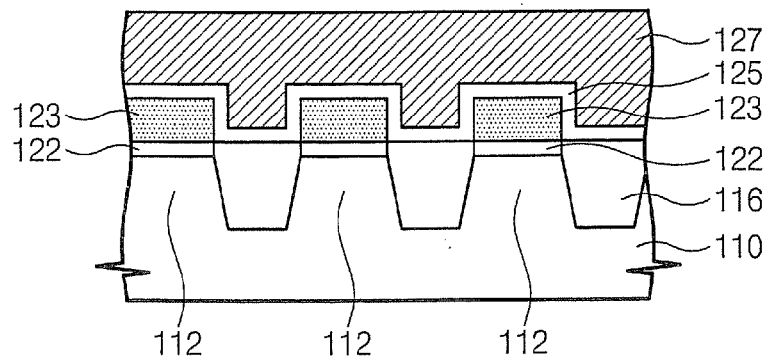
Figure 12B:
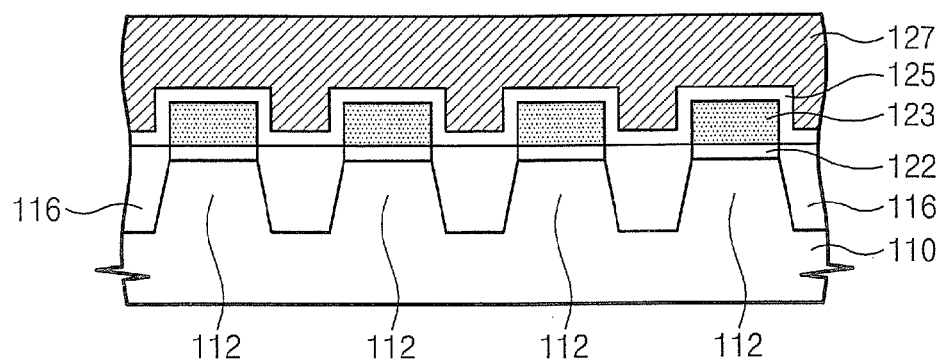
Figure 12C:
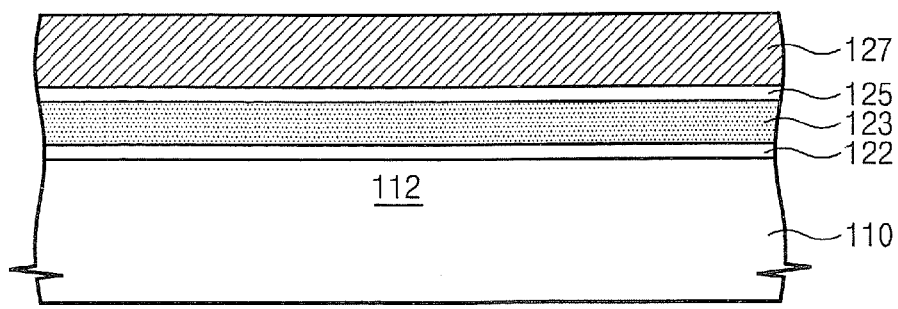
Figure 13A:
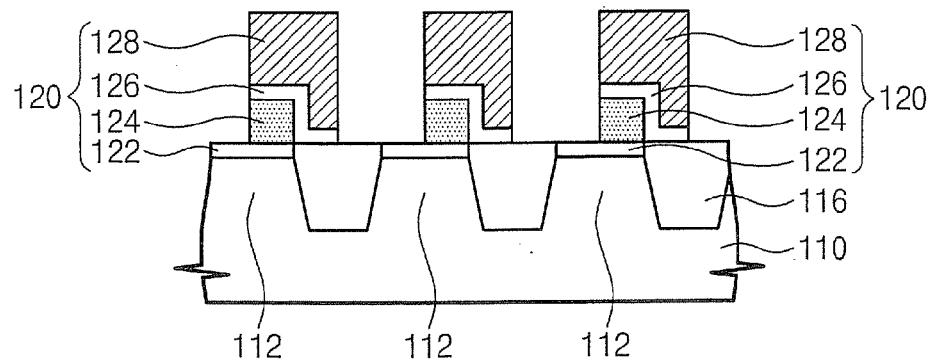
Figure 13B:
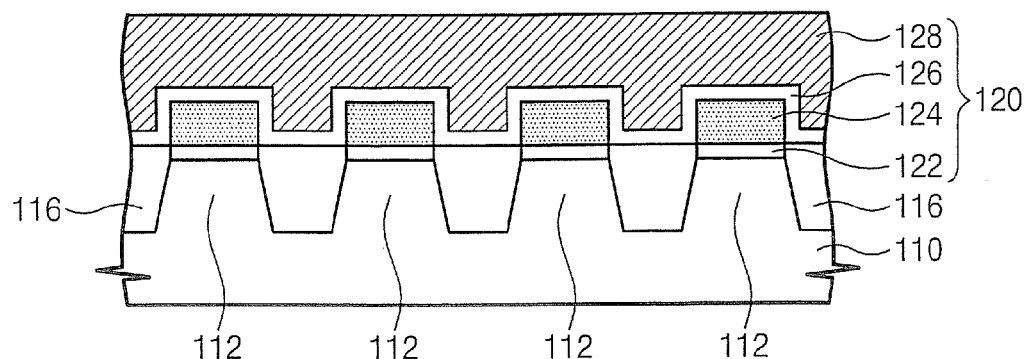
Figure 13C:
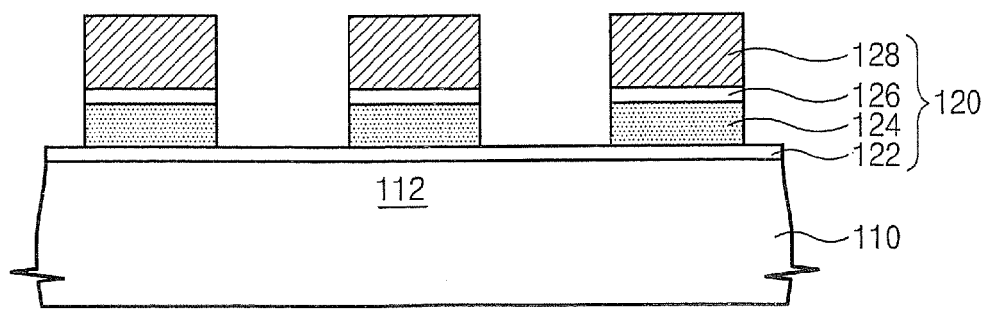
Figure 14A:
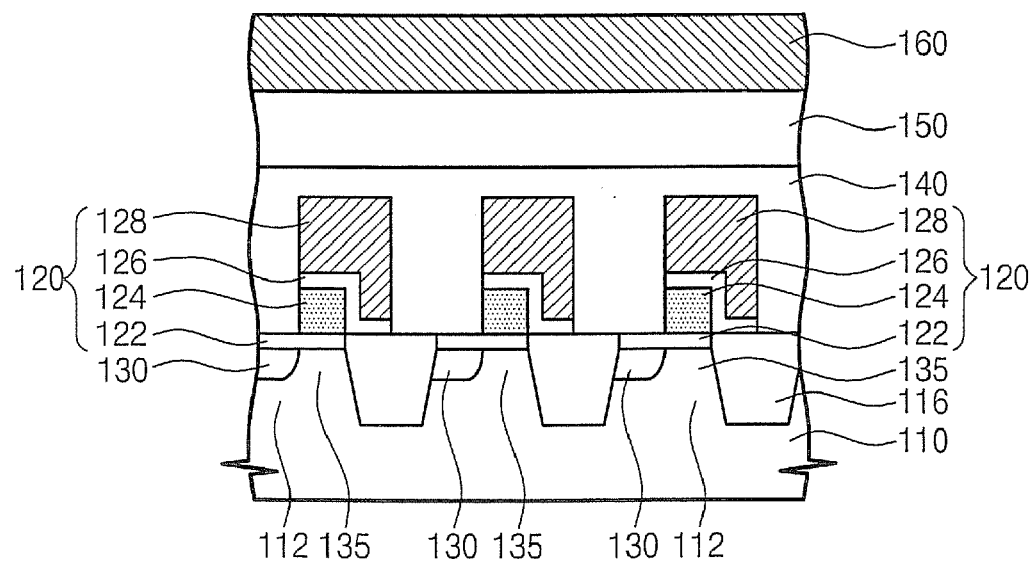
Figure 14B:
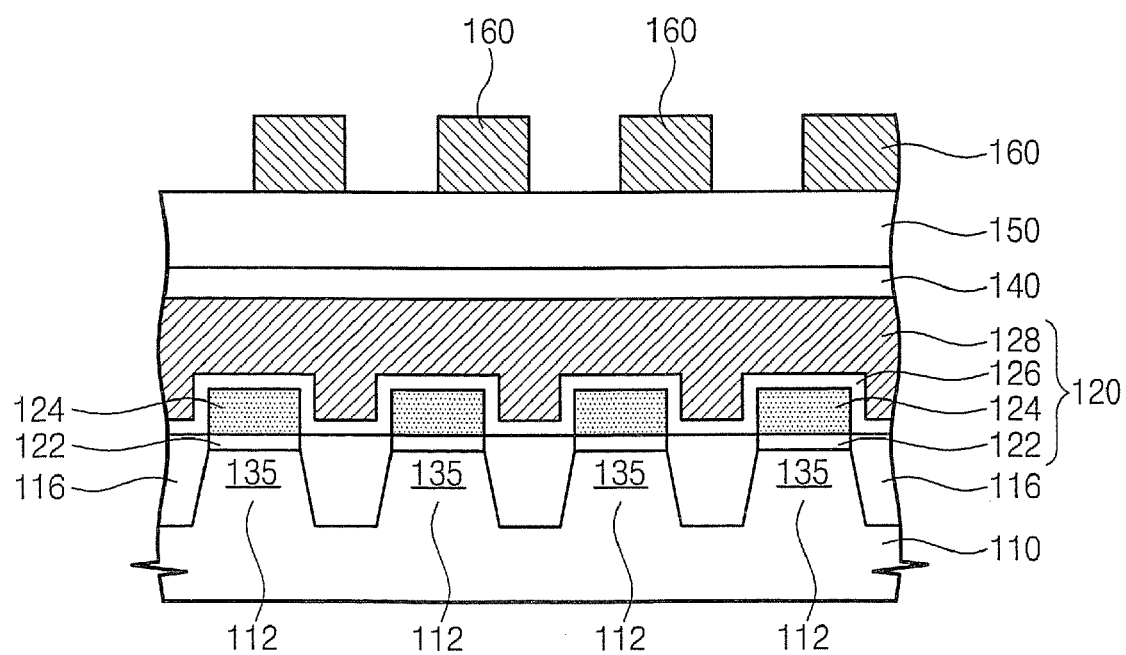
Figure 14C:
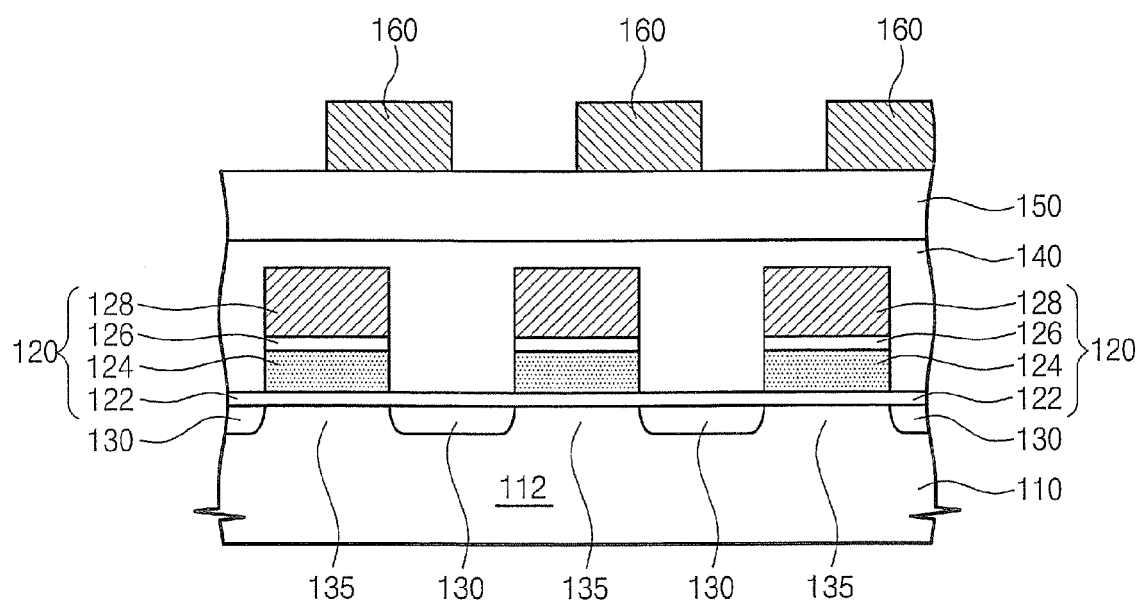

FIG. 6 is a schematic plan view of a nonvolatile memory device according to other embodiments of the present invention. These embodiments will be described with an emphasis on differences from the previous embodiments.

Referring to FIG. 6, the first direction DA in which the active region 112 extends is orthogonal to the second direction DW in which the word line WL extends. However, it is noted that the active region 112 in the present embodiments can be wholly or partially formed in a zigzag configuration, unlike in the previous embodiments. For example, the active regions 112 are formed in a zigzag configuration between the string selection lines SSL and the ground selection lines GSL, and in a straight line configuration between the string selection lines SSL and between the ground selection lines GSL. In the active regions 112 having the zigzag configuration, a corner of the active regions 112 may be positioned adjacent, and in some embodiments on the same line as, a side surface of the word line WL.

Like in the previous embodiments, in the present embodiments, the overlapping portion of two side surfaces of the adjacent floating gates adjacent and parallel with each other in the first direction DA is not present or is smaller than an area of each of the side surfaces. Accordingly, electrical interference generated between the floating gates adjacent one another in the first direction can be reduced.

FIGS. 7 through 14 are cross-sectional views illustrating methods of forming a nonvolatile memory device according to various embodiments of the present invention. Specifically, FIGS. 7A through 14A are cross-sectional views taken along the line A-A' of FIG. 4, FIGS. 7B through 14B are cross-sectional views taken along the line B-B' of FIG. 4, and FIGS. 7C through 14C are cross-sectional views taken along the line C-C' of FIG. 4.

Referring to FIGS. 4, and 7A through 7C, a mask pattern 210 is formed on a substrate such as a semiconductor substrate 110. A variety of substrates, for example, a single crystal bulk silicon substrate, a silicon on insulator (SOI) substrate and the like can be used for the semiconductor substrate 110. The mask pattern 210 extends in the first direction DA and corresponds to an active region in the semiconductor substrate 110. The mask pattern 210 can be formed of a multi-layer of an oxide layer 212 and a nitride layer 214. The oxide layer 212 can alleviate a stress generated between the nitride layer 214 and the semiconductor substrate 110.

Referring to FIGS. 4 and 8A through 8C, the semiconductor substrate 110 is etched using the mask pattern 210 as an etch mask to form a trench 115t. Thus, an active region 112 is formed in the semiconductor substrate 110 between the trenches 115t. The active region 112 extends in the first direction DA. Thereafter, a thermal oxidation process for curing an inner wall surface of the trench 115t, and a liner layer forming process for reducing or preventing foreign particles from penetrating into the active region 112 may also be performed.

Referring to FIGS. 4 and 9A through 9C, a thin film forming process is performed to fill an inside of the trench 115t with an insulator, and a planarizing process exposing an upper surface of the mask pattern 210 is performed to form a device isolation layer 115. A chemical vapor deposition (CVD) process can be used for the thin film forming process, and a chemical mechanical polishing (CMP) process and/or an etch-back process can be used for the planarizing process. The device isolation layer 115 may be formed of a material having an etch selectivity with regard to the nitride layer 214, for example, oxide.

Referring to FIGS. 4 and 10A through 10C, after the mask pattern 210 is removed, a gate insulating layer 122 is formed on the active region 112 exposed between the device isolation layers 115. The gate insulating layer 122 can be formed by performing a thermal oxidation process. Thereafter, a thin film forming process is performed to form a conductive layer on the surface of the semiconductor substrate 110, and then a planarizing process exposing an upper surface of the device isolation layer 115 is performed to form a floating gate conductive layer 123. The floating gate conductive layer 123 can be formed of, for example, doped polysilicon. The floating gate conductive layer 123 extends in the first direction DA.

Referring to FIGS. 4 and 11A through 11C, an etch process for recessing the upper surface of the device isolation layer is performed to form a device isolation layer pattern 116. Since an excessive recess of the upper surface of the device isolation layer may cause the sidewalls of the gate insulating layer 122 to be damaged, in some embodiments the upper surface of the device isolation layer pattern 116 is formed higher than or at the same level as the upper surface of the gate insulating layer 122.

Referring to FIGS. 4 and 12A through 12C, a thin film forming process is performed to form a preliminary intergate insulating layer 125 and a control gate conductive layer 127 on the surface of the semiconductor substrate 110. The preliminary intergate insulating layer 125 may be formed as a multi-layer of oxide layer/nitride layer/oxide, and the control gate conductive layer may be formed of doped polysilicon and/or a multi-layer of doped polysilicon and silicide.

Referring to FIGS. 4 and 13A through 13C, the control gate conductive layer, the preliminary intergate insulating layer, and the floating gate conductive layer are sequentially etched to form a control gate 128, an intergate insulating layer 126 and a floating gate 124. By the above processes, the gate structure 120 in which the gate insulating layer 122, the floating gate 124, the intergate insulating layer 126 and the control gate 128 are sequentially stacked on the active region 112, is formed. The control gate 128 extends in the second direction DW to constitute the word line WL. An angle between the first direction DA and the second direction DW is smaller than 90°, for example, may be about 45°. The floating gates 124 are arranged in a matrix or array configuration and are arranged at a slant (oblique) angle with respect to the second direction DW.

Referring to FIGS. 4 and 14A through 14C, an ion implantation process is performed to form impurity regions 130 in the active region 112 at both sides of the gate structure 120. The active region between the impurity regions 130 (i.e., active region below the gate structure) becomes a channel region.

Thereafter, a first interlayer insulating layer 140 on the surface of the semiconductor substrate 110 is formed, and then patterned to form a common source line CSL. A second interlayer insulating layer 150 is formed on the first interlayer insulating layer 140. The first interlayer insulating layer 140 and the second interlayer insulating layer 150 are patterned to form a bit line contact DC. A bit line 160 connected to the bit line contact DC and extending in the third direction DB is formed on the second interlayer insulating layer 150. The third direction DB crosses the first direction DA and the second direction DW. For example, angles between the third direction DB and the first direction DA and between the third direction DB and the second direction DW can be about 45° and about 90°, respectively.

In these embodiments, the direction in which the active region extends is not orthogonal to the direction in which the word line extends. However, the active region and the word line may be formed in directions orthogonal to each other (see FIG. 6). The active regions may be formed wholly or partially in a zigzag configuration, and thus the charge storage region defined by a crossing of the active region and the word line can be formed at an oblique angle with respect to the word line. By doing so, the same effect as that of the earlier embodiments can be obtained. Also, the word line can be formed such that a side surface thereof is positioned on the same line as a corner of the active region. In addition, while the word line is formed, these embodiments can further include forming a string selection line and a ground selection line extending in the word line direction. The active region can be formed in a zigzag configuration only between the string selection line and the ground selection line.

According to various embodiments of the present invention, electrical interference that may be generated between adjacent memory cells can be reduced by increasing a distance between the charge storage regions (i.e., by reducing an area of an overlapping portion of two side surfaces of the adjacent charge storage regions facing each other in parallel) without the need to lower the integration density of memory devices. As such, the reliability and operation characteristics of the memory devices can be enhanced.

The above-disclosed subject matter is to be considered illustrative, and not restrictive, and the appended claims are intended to cover all such modifications, enhancements, and other embodiments, which fall within the true spirit and scope of the present invention. While the above embodiments describe the floating gate type flash memory devices, the present invention is not limited thereto and can be applied to other nonvolatile memory devices. For example, the embodiments of the present invention can be applied to a charge trap type flash memory device that also employ charge storage regions. Moreover, an insulating layer, such as a nitride layer or the like used as the charge storage layer, may not be patterned in the active region direction, but the charge storage region can be defined by a crossing of the active region and the word line.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A nonvolatile memory device comprising: an active region defined by a device isolation layer in a substrate; a word line crossing the active region; a nonvolatile memory cell charge storage region defined by a crossing of the active region and the word line and disposed between the active region and the word line; and a bit line crossing the word line and extending along a third direction crossing a first direction and a second direction, wherein the nonvolatile memory cell charge storage region is disposed at an oblique angle with respect to the word line, wherein the active region extends in the first direction and the word line extends in the second direction crossing the first direction, and the first direction is oblique to the second direction, and wherein the third direction is orthogonal to the second direction.

2. The nonvolatile memory device of claim 1, wherein an angle between the first direction and the second direction is about 45°.

3. A method for forming a nonvolatile memory device, the method comprising: forming a device isolation layer defining an active region in a substrate; forming a nonvolatile memory cell charge storage layer on the active region; forming a word line crossing the charge storage layer and crossing the active region; and forming a bit line crossing the word line and extending in a third direction crossing a second direction at a right angle, wherein the nonvolatile memory cell charge storage region is defined by a crossing of the active region and the word line, and is formed at an oblique angle with respect to the word line, and wherein the active region is formed to extend in a first direction and the word line is formed to extend in the second direction which is oblique to the first direction.

4. The method of claim 3, wherein an angle between the first direction and the second direction is about 45°.

* * * * *